(12) United States Patent
Pai et al.

(10) Patent No.: US 11,653,583 B2
(45) Date of Patent: May 16, 2023

(54) RESISTIVE RANDOM ACCESS MEMORIES AND METHOD FOR FABRICATING THE SAME

(71) Applicant: Winbond Electronics Corp., Taichung (TW)

(72) Inventors: Chang-Tsung Pai, Taichung (TW); Ming-Che Lin, Taichung (TW); Chi-Ching Liu, Chiayi (TW); He-Hsuan Chao, Hsinchu (TW); Chia-Wen Cheng, Hsinchu (TW)

(73) Assignee: WINBOND ELECTRONICS CORP., Taichung (TW)

( * ) Notice: Subject to any disclaimer, the term of this patent is extended or adjusted under 35 U.S.C. 154(b) by 37 days.

(21) Appl. No.: 16/922,253

(22) Filed: Jul. 7, 2020

(65) Prior Publication Data

US 2021/0013408 A1 Jan. 14, 2021

(30) Foreign Application Priority Data

Jul. 8, 2019 (TW) .................................. 108123890

(51) Int. Cl.
*H01L 45/00* (2006.01)
(52) U.S. Cl.
CPC ......... *H10N 70/8833* (2023.02); *H10B 63/00* (2023.02); *H10N 70/021* (2023.02); *H10N 70/841* (2023.02)
(58) Field of Classification Search
CPC ............. H01L 45/1233; H01L 45/1246; H01L 45/1273; H01L 45/165
See application file for complete search history.

(56) References Cited

U.S. PATENT DOCUMENTS

| 6,015,977 | A  | * | 1/2000 | Zahorik | H01L 27/101 |
| | | | | | 257/E27.071 |
| 6,670,628 | B2 | * | 12/2003 | Lee | H01L 27/2463 |
| | | | | | 257/4 |
| 11,183,394 | B2 | * | 11/2021 | Chen | H01L 45/1233 |
| 11,189,792 | B2 | * | 11/2021 | Grenouillet | H01L 27/2472 |
| 2015/0236257 | A1 | | 8/2015 | Walls et al. | |
| 2018/0026184 | A1 | | 1/2018 | Kwon et al. | |
| 2018/0301507 | A1 | * | 10/2018 | Bedau | H01L 45/1246 |

FOREIGN PATENT DOCUMENTS

| CN | 105280811 A | 1/2016 |
| TW | 201601288 A | 1/2016 |
| WO | WO-2018091828 A1 | 5/2018 |

* cited by examiner

*Primary Examiner* — Mark V Prenty
(74) *Attorney, Agent, or Firm* — Muncy, Geissler, Olds & Lowe, P.C.

(57) ABSTRACT

A resistive random access memory is provided. The resistive random access memory includes a bottom electrode, a metal oxide layer including a plurality of conductive filament regions formed on the bottom electrode, and a plurality of top electrodes formed on the metal oxide layer, corresponding to the respective conductive filament regions. Each of the conductive filament regions has a bottom portion and a top portion. The width of the bottom portion is greater than that of the top portion. The conductive filament regions include oxygen vacancies, and regions other than the conductive filament regions in the metal oxide layer are nitrogen-containing regions.

12 Claims, 16 Drawing Sheets

RESISTIVE RANDOM ACCESS MEMORIES AND METHOD FOR FABRICATING THE SAME

CROSS REFERENCE TO RELATED APPLICATIONS

This application claims priority of Taiwan Patent Application No. 108123890, filed on Jul. 8, 2019, the entirety of which is incorporated by reference herein.

TECHNICAL FIELD

The technical field relates to a resistive random access memory capable of enhancing local electric field.

BACKGROUND

Resistive random access memories (RRAM) have the advantages of fast operation speed and low power consumption. It is ideal for the next generation of non-volatile memory. In a resistive random access memory, a transition metal oxide (TMO) layer is disposed between two metal electrodes. The status of conductive filaments in the transition metal oxide layer is controlled to electrically switch between a high-resistance state (HRS) and a low-resistance state (LRS).

However, in the operation of a resistive random access memory, since the conductive filaments are susceptible to the surrounding environment, it is difficult to control the formation and rupture of the conductive filaments, resulting in the resistive random access memory being less reliable; for example, it may have poor endurance and retention.

SUMMARY

In accordance with one embodiment of the invention, a resistive random access memory is provided. The resistive random access memory includes a bottom electrode, a metal oxide layer including a plurality of conductive filament regions formed on the bottom electrode, and a plurality of top electrodes formed on the metal oxide layer, corresponding to the respective conductive filament regions. Each of the conductive filament regions has a bottom portion and a top portion. The width of the bottom portion is greater than that of the top portion. The conductive filament regions include oxygen vacancies, and regions other than the conductive filament regions in the metal oxide layer are nitrogen-containing regions.

In accordance with one embodiment of the invention, a method for fabricating a resistive random access memory is provided, including the following steps, for example, a substrate is provided, a plurality of trenches are formed in the substrate, a plurality of bottom electrodes are formed in the trenches, a plurality of metal oxide layers are formed on the bottom electrodes and surrounded by the bottom electrodes, a nitrogen-ion process is performed on the metal oxide layers to form a plurality of conductive filament regions and nitrogen-containing regions other than the conductive filament regions in the metal oxide layers, and a plurality of top electrodes are formed on the metal oxide layers.

In the present invention, the distribution region (i.e. a conduction path formed by oxygen ion migration) of the conductive filament in the transition metal oxide (TMO) layer is defined and limited by related nitrogen-ion processes (e.g., ion implantation, plasma, annealing, etc.), effectively enhancing the local electric field (i.e. the electric field in the conductive filament region) in the component. The present resistive random access memory (RRAM) having the specific distribution profile of the conductive filament can effectively control the formation and rupture of a single conductive filament, avoiding the formation of multiple conductive filaments, and promoting the reliability of the memory, for example, improved endurance and retention. Furthermore, the present invention can reduce the forming/operation voltage and suppress the fluctuations between a high resistance state (HRS) and a low resistance state (LRS), allowing the components to maintain wide operating windows.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
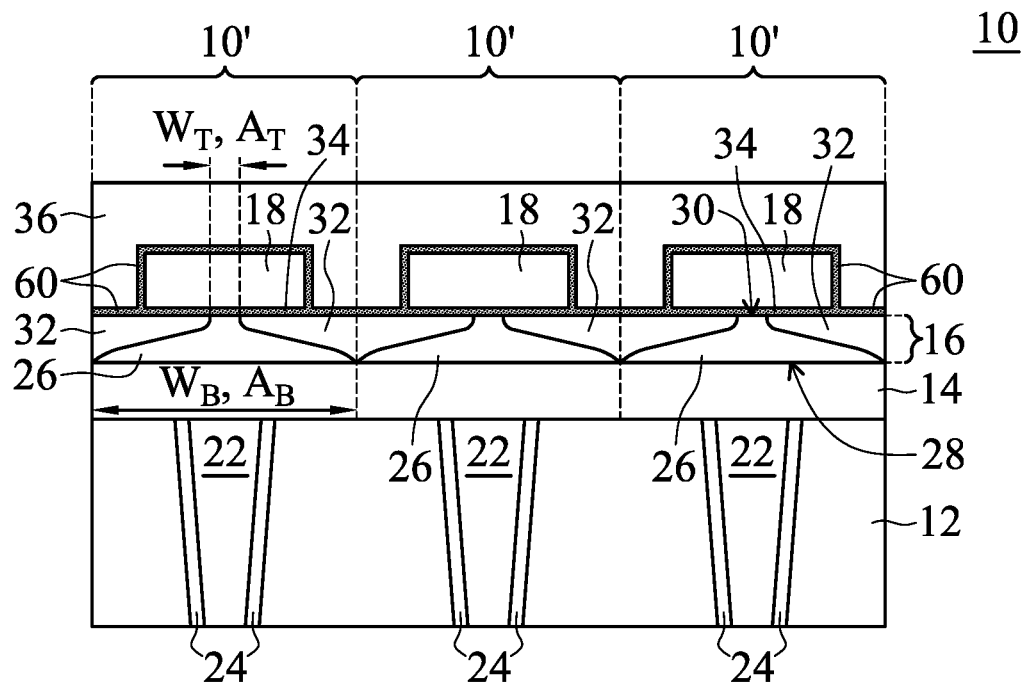
FIG. 1 is a cross-sectional view in accordance with one embodiment of the invention.

Referring to FIG. 1, a resistive random access memory 10 includes a substrate 12, a bottom electrode 14, a metal oxide layer 16 and top electrodes 18. Vias are formed in the substrate 12 and filled with conductive material 22. The conductive material 22 may include, for example, tungsten or copper. Via liners 24 are further formed between the sidewalls of the vias and the conductive material 22. The via liners 24 may include multiple material layers of tantalum nitride/tantalum or titanium/titanium nitride. The bottom electrode 14 is formed on the substrate 12 and electrically connected to the conductive material 22 in the substrate 12. The bottom electrode 14 is a continuous bottom electrode, that is, the bottom electrode 14 is conformally formed on the substrate 12. The metal oxide layer 16 is a continuous metal oxide layer and formed on the bottom electrode 14, that is, the metal oxide layer 16 is conformally formed on the bottom electrode 14. Specifically, the metal oxide layer 16 includes conductive filament regions 26 that are adjacent to each other. Each of the conductive filament regions 26 has a bottom portion 28 and a top portion 30. The width "$W_B$"

of the bottom portion 28 is greater than the width "$W_T$" of the top portion 30. It can also be considered that the projected area "$A_B$" of the bottom portion 28 to the bottom electrode 14 is larger than the projected area "$A_T$" of the top portion 30 to the bottom electrode 14 of the conductive filament region 26. In some embodiments, the ratio of the width "$W_B$" of the bottom portion 28 and the width "$W_T$" of the top portion 30 of the conductive filament region 26 is in a range from about 1:1 to about 50:1. In some embodiments, the bottom portions 28 of the two adjacent conductive filament regions 26 may or may not be in substantial contact. In addition, the separated top electrodes 18 are formed on the metal oxide layer 16, corresponding to the respective conductive filament regions 26. The bottom electrode 14 and the top electrodes 18 may include, for example, titanium, titanium nitride, tantalum, tantalum nitride, platinum or gold. In some embodiments, the metal oxide layer 16 may include any suitable transition metal oxide (TMO), such as hafnium oxide, titanium oxide, tantalum oxide, zirconium oxide or nickel oxide. Specifically, in the metal oxide layer 16, the regions 32 other than the conductive filament regions 26 are nitrogen-containing regions, corresponding to the regions between the two adjacent top electrodes 18 above the regions 32. In some embodiments, the nitrogen concentration in the regions 32 is in a range from about $1\times10^{14}$ to about $1\times10^{16}$ cm$^{-2}$. As shown in FIG. 1, the bottom electrode 14, the metal oxide layer 16 (including the conductive filament regions 26) and the top electrodes 18 constitute resistive random access memory units 10'. That is, the resistive random access memory units 10' connected to each other by the bottom electrode 14 and the metal oxide layer 16 are formed on the substrate 12.

The resistive random access memory 10 further includes a first capping layer 34 between the metal oxide layer 16 and the top electrodes 18, and a second capping layer 60 formed on the metal oxide layer 16 and covering the top electrodes 18. In some embodiments, the first capping layer 34 and the second capping layer 60 may include any suitable metal or metal oxide, for example, aluminum oxide, hafnium or tantalum oxide. The resistive random access memory 10 further includes a dielectric material layer 36 formed on the second capping layer 60 and filled into the regions between adjacent top electrodes 18. In some embodiments, the dielectric material layer 36 may include silicon oxide, silicon nitride or silicon oxynitride. In addition, the dielectric material layer 36 is formed by, for example, high density plasma chemical vapor deposition (HDP-CVD).

Figure 2:
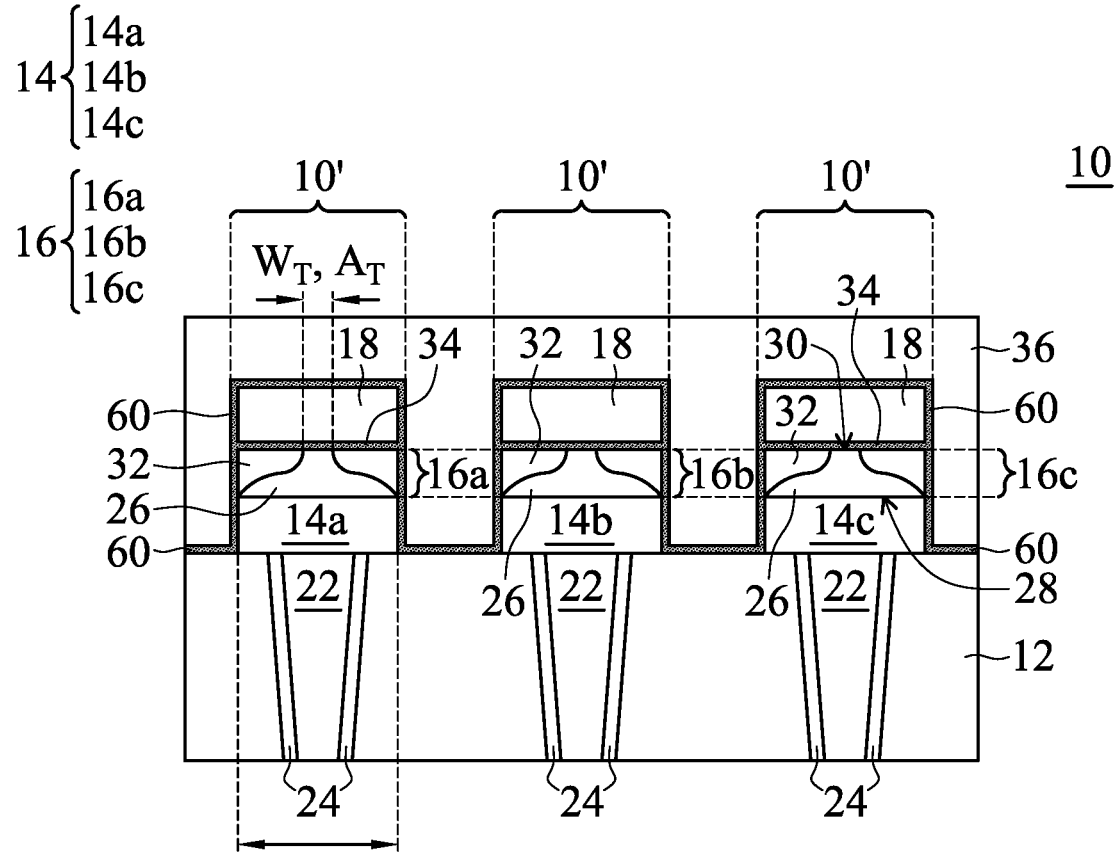
FIG. 2 is a cross-sectional view in accordance with one embodiment of the invention.

Referring to FIG. 2, the difference between this embodiment and the embodiment of FIG. 1 is that their structures are different. The following only illustrates the differences, and will not repeat the same parts. In this embodiment, the bottom electrode 14 includes separated portions (14a, 14b and 14c) formed on the substrate 12 and electrically connected to the respective vias in the substrate 12. The metal oxide layer 16 includes separated portions (16a, 16b and 16c) formed on the respective separated portions (14a, 14b and 14c) of the bottom electrode 14. Specifically, each of the separated portions (16a, 16b and 16c) of the metal oxide layer 16 includes one conductive filament region 26. Specifically, in the metal oxide layer 16, the regions 32 other than the conductive filament regions 26 are nitrogen-containing regions. In some embodiments, the nitrogen concentration in the regions 32 is in a range from about $1\times10^{14}$ to about $1\times10^{16}$ cm$^{-2}$. As shown in FIG. 2, one of the separated portions (14a, 14b and 14c) of the bottom electrode 14, one of the separated portions (16a, 16b and 16c) (including the conductive filament region 26) of the metal oxide layer 16 and one of the top electrodes 18 constitute a resistive random access memory unit 10'. That is, the separated resistive random access memory units 10' are formed on the substrate 12.

The resistive random access memory 10 further includes a first capping layer 34 between the metal oxide layer 16 and the top electrodes 18, and a second capping layer 60 formed on the substrate 12 and covering the resistive random access memory units 10'. The resistive random access memory 10 further includes a dielectric material layer 36 formed on the second capping layer 60 and filled into the regions between adjacent resistive random access memory units 10'. As shown in FIG. 2, adjacent resistive random access memory units 10' are separated from each other by the dielectric material layer 36.

Figure 3:
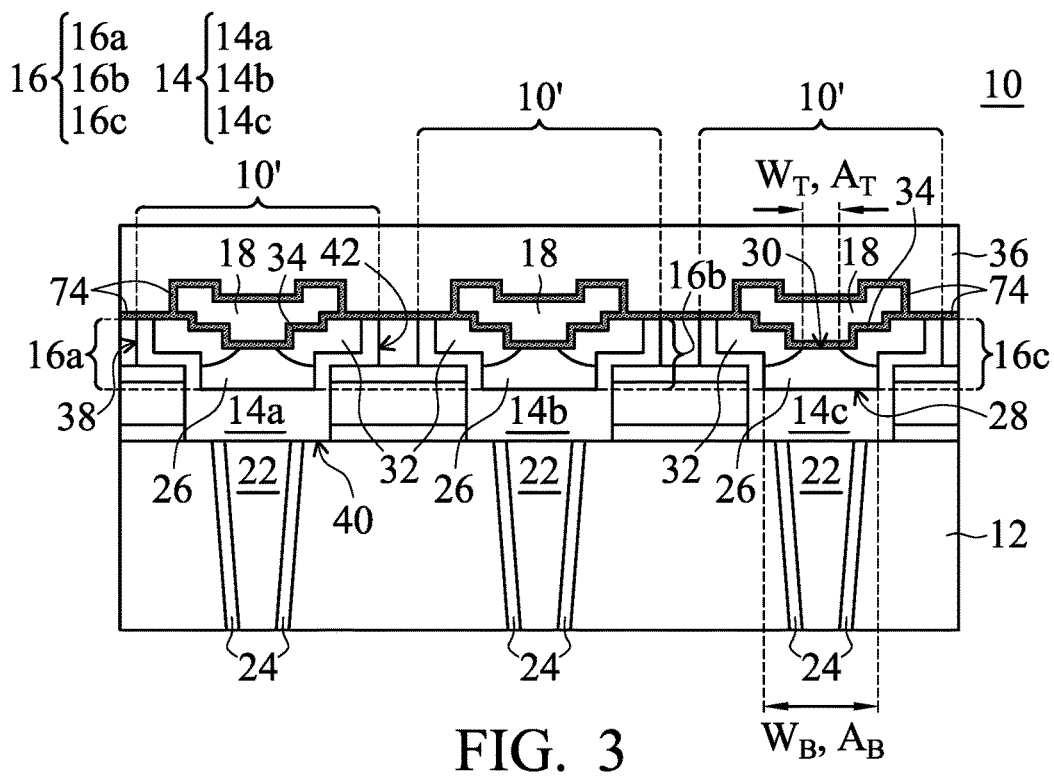
FIG. 3 is a cross-sectional view in accordance with one embodiment of the invention.

Referring to FIG. 3, the difference between this embodiment and the embodiment of FIG. 1 is that their structures are different. The following only illustrates the differences, and will not repeat the same parts. In this embodiment, separated trenches 38 are further formed in the substrate 12 located above the vias, corresponding to the respective below vias. The bottom electrode 14 includes separated portions (14a, 14b and 14c) formed in the respective trenches 38 of the substrate 12; for example, they may be formed on the bottom portions 40 and the sidewalls 42 of the trenches 38 and they may be electrically connected to the below vias. The metal oxide layer 16 includes separated portions (16a, 16b and 16c) formed on the respective separated portions (14a, 14b and 14c) of the bottom electrode 14 in the trenches 38 and surrounded by the separated portions (14a, 14b and 14c) of the bottom electrode 14. Specifically, each of the separated portions (16a, 16b and 16c) of the metal oxide layer 16 includes one conductive filament region 26. Specifically, in the metal oxide layer 16, the regions 32 other than the conductive filament regions 26 are nitrogen-containing regions. In some embodiments, the nitrogen concentration in the regions 32 is in a range from about $1\times10^{14}$ to about $1\times10^{16}$ cm$^{-2}$. As shown in FIG. 3, one of the separated portions (14a, 14b and 14c) of the bottom electrode 14, one of the separated portions (16a, 16b and 16c) (including the conductive filament region 26) of the metal oxide layer 16 and one of the top electrodes 18 constitute a resistive random access memory unit 10'. That is, the separated resistive random access memory units 10' are formed in the trenches 38 of the substrate 12.

The resistive random access memory 10 further includes a first capping layer 34 between the metal oxide layer 16 and the top electrodes 18, and a third capping layer 74 formed on the substrate 12, the bottom electrode 14 and the metal oxide layer 16 and covering the top electrodes 18. The resistive random access memory 10 further includes a dielectric material layer 36 formed on the third capping layer 74 and filled into the regions between adjacent top electrodes 18.

Figure 4:
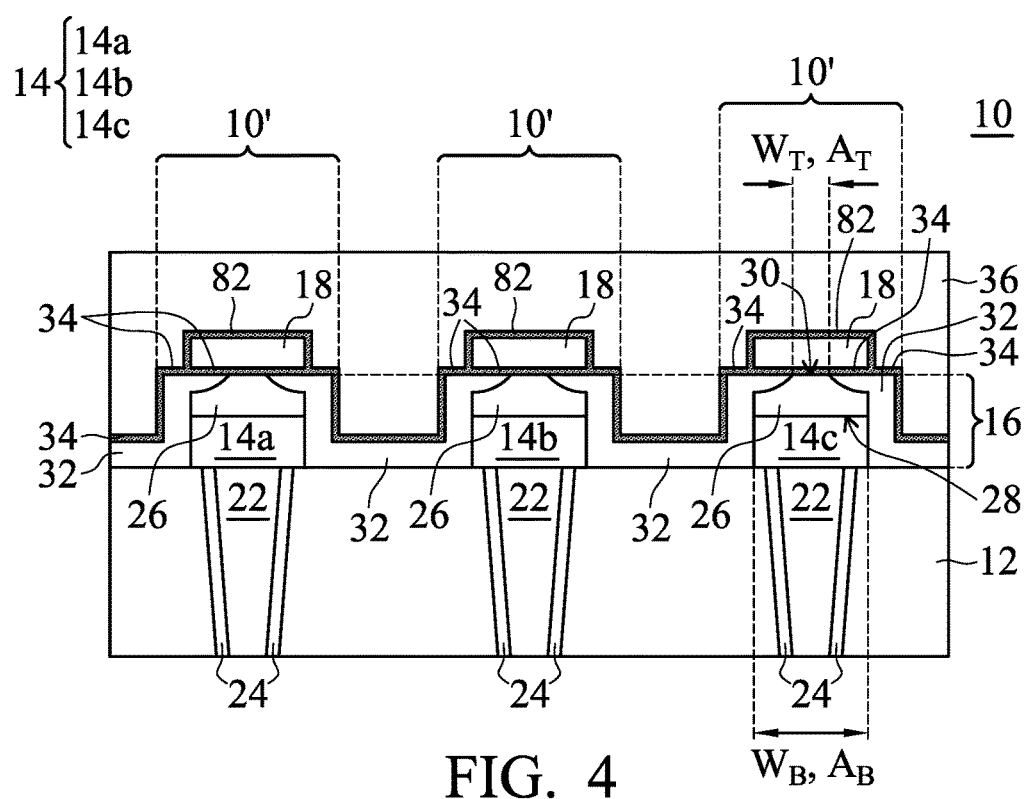
FIG. 4 is a cross-sectional view in accordance with one embodiment of the invention.

Referring to FIG. 4, the difference between this embodiment and the embodiment of FIG. 1 is that their structures are different. The following only illustrates the differences, and will not repeat the same parts. In this embodiment, the bottom electrode 14 includes separated portions (14a, 14b and 14c) respectively formed on the substrate 12 and electrically connected to the vias in the substrate 12. The metal oxide layer 16 is a continuous metal oxide layer and formed on the bottom electrode 14, that is, the metal oxide layer 16 is conformally formed on the substrate 12 and the bottom electrode 14, covering the bottom electrode 14. Specifically, the metal oxide layer 16 includes conductive filament regions 26 separated from each other. Specifically, in the metal oxide layer 16, the regions 32 other than the conductive filament regions 26 are nitrogen-containing regions. In some embodiments, the nitrogen concentration in the regions 32 is in a range from about $1\times10^{14}$ to about $1\times10^{16}$ cm$^{-2}$. As shown in FIG. 4, one of the separated portions (14a, 14b and 14c) of the bottom electrode 14, the metal oxide layer 16 (including the conductive filament region 26) and one of the top electrodes 18 constitute a resistive random access memory unit 10'. That is, the resistive random access memory units 10' connected to each other by the metal oxide layer 16 are formed on the substrate 12.

The resistive random access memory 10 further includes a first capping layer 34 between the metal oxide layer 16 and the top electrodes 18, and a fourth capping layer 82 formed on the metal oxide layer 16 and covering the top electrodes 18. The resistive random access memory 10 further includes a dielectric material layer 36 formed on the fourth capping layer 82 and filled into the regions between adjacent top electrodes 18.

Figure 5:
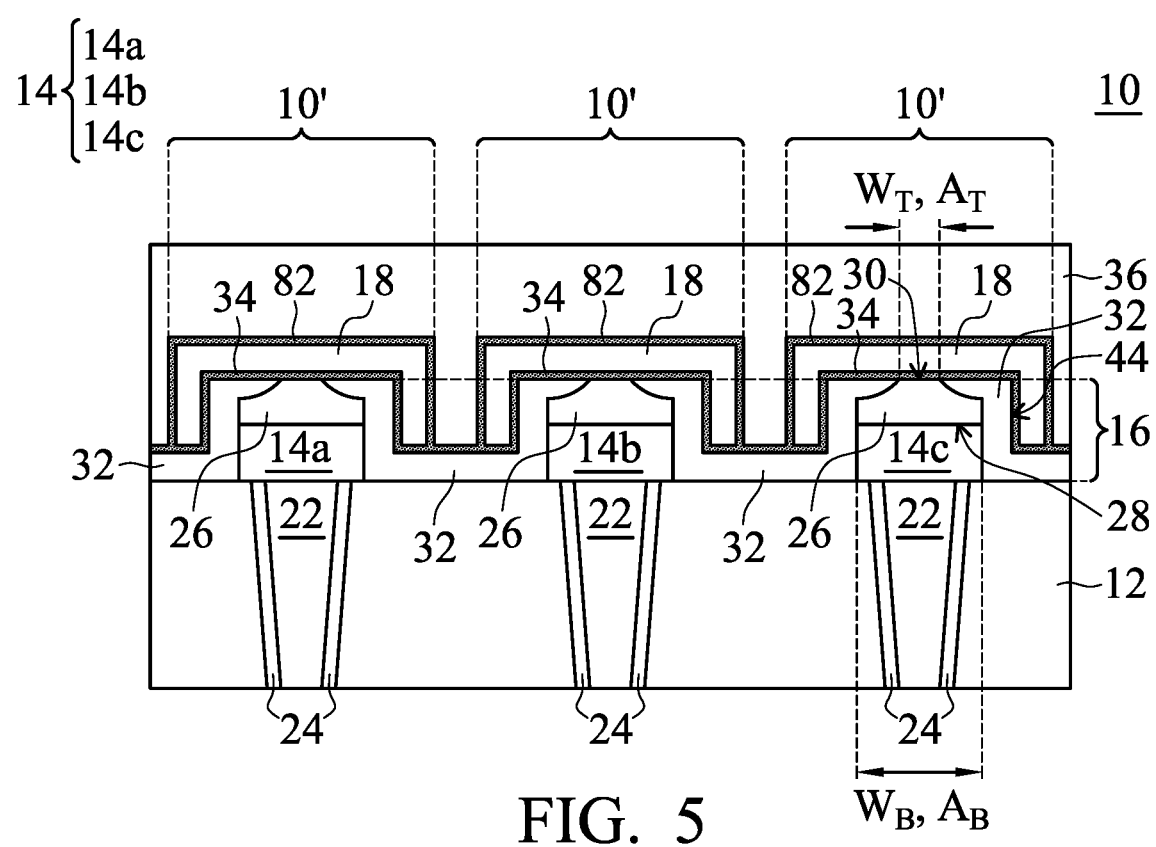
FIG. 5 is a cross-sectional view in accordance with one embodiment of the invention.

Referring to FIG. 5, the difference between this embodiment and the embodiment of FIG. 1 is that their structures are different. The following only illustrates the differences, and will not repeat the same parts. In this embodiment, the bottom electrode 14 includes separated portions (14a, 14b and 14c) respectively formed on the substrate 12 and electrically connected to the vias in the substrate 12. The metal oxide layer 16 is a continuous metal oxide layer and formed on the bottom electrode 14, that is, the metal oxide layer 16 is conformally formed on the substrate 12 and the bottom electrode 14, covering the bottom electrode 14. Specifically, the metal oxide layer 16 includes conductive filament regions 26 separated from each other. Specifically, in the metal oxide layer 16, the regions 32 other than the conductive filament regions 26 are nitrogen-containing regions. In some embodiments, the nitrogen concentration in the regions 32 is in a range from about $1\times10^{14}$ to about $1\times10^{16}$ cm$^{-2}$. In addition, each of the top electrodes 18 further extends to cover the sidewalls 44 of the metal oxide layer 16. As shown in FIG. 5, one of the separated portions (14a, 14b and 14c) of the bottom electrode 14, the metal oxide layer 16 (including the conductive filament region 26) and one of the top electrodes 18 constitute a resistive random access memory unit 10'. That is, the resistive random access memory units 10' connected to each other by the metal oxide layer 16 are formed on the substrate 12.

The resistive random access memory 10 further includes a first capping layer 34 between the metal oxide layer 16 and the top electrodes 18, and a fourth capping layer 82 formed on the metal oxide layer 16 and covering the top electrodes 18. The resistive random access memory 10 further includes a dielectric material layer 36 formed fourth capping layer 82 and filled into the regions between adjacent top electrodes 18.

Figure 6A:
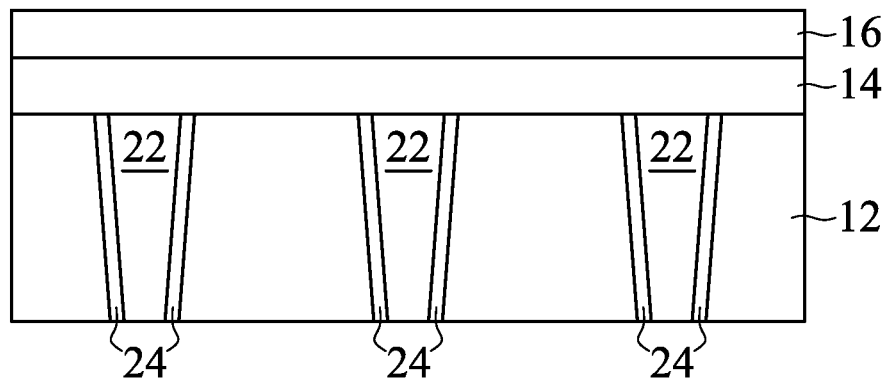
FIGS. 6A-6H shows a fabrication method in accordance with one embodiment of the invention.

Referring to FIG. 6A, in accordance with one embodiment of the invention, a cross-sectional view of a method for fabricating a resistive random access memory is shown. First, a substrate 12 is provided. Vias are formed in the substrate 12 and filled with conductive material 22 and via liners 24 surrounding the conductive material 22. Next, a bottom electrode layer 14 and a metal oxide layer 16 are sequentially formed on the substrate 12.

Figure 6B:
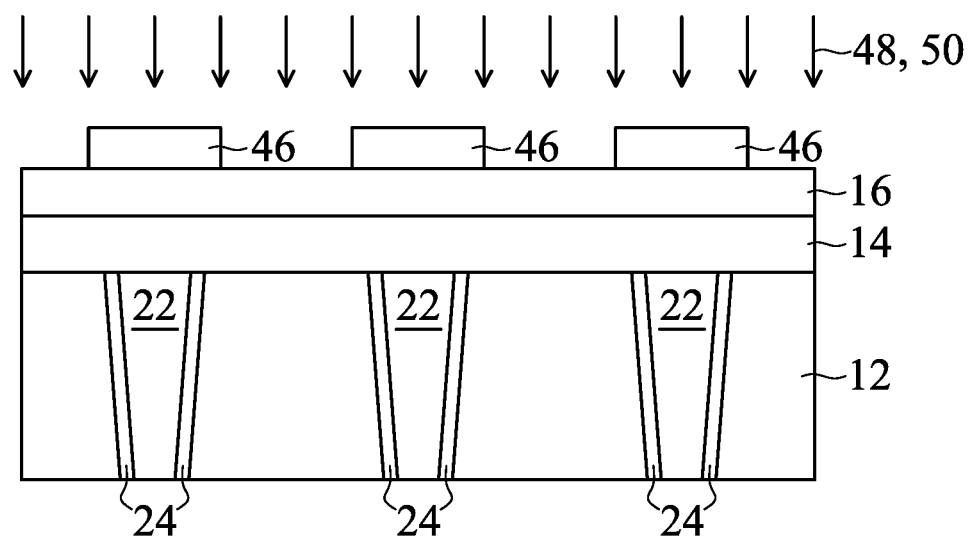

Referring to FIG. 6B, a patterned photoresist layer 46 is then formed on the metal oxide layer 16. Next, a nitrogen-ion process, for example a nitrogen-ion implantation process 48, is performed on the metal oxide layer 16 using the patterned photoresist layer 46 as a mask. In some embodiments, the nitrogen-ion implantation process 48 has an implant angle of between about zero and about 45 degrees, an implant energy of between about 0.2 and about 1.0 keV, and an implant concentration of between about $2\times10^{15}$ and about $1\times10^{16}$ cm$^{-2}$. There are four to eight rotations in the nitrogen-ion implantation process 48, and each rotation has a rotation angle of between about 45 and about 90 degrees. In some embodiments, different ranges and profiles of implant regions can be obtained by adjusting the parameters of the nitrogen-ion implantation process 48. For example, different ranges and profiles of implant regions can be obtained by adjusting the implant energy (for example, high, medium and low) of the nitrogen-ion implantation process 48. For example, when the implantation process is performed with a high implant energy, since the implanted nitrogen ions are mostly located adjacent to the bottom of the metal oxide layer 16, the formed implant region exhibits a profile that the lower portion is wide and the upper portion is narrow (similar to a ladder profile), that is, in the implant region, the wider the region closer to the bottom of the metal oxide layer 16, and the narrower the region closer to the top of the metal oxide layer 16. When the implantation process is performed with a medium implant energy, since the implanted nitrogen ions are mostly located in the upper half of the metal oxide layer 16, the formed implant region exhibits a profile that the lower portion is narrow and the upper portion is wide (similar to an inverted triangle profile), that is, in the implant region, the narrower the region closer to the bottom of the metal oxide layer 16, and the wider the region closer to the top of the metal oxide layer 16. When the implantation process is performed with a low implant energy, since the implanted nitrogen ions are also mostly located in the upper half of the metal oxide layer 16, but more adjacent to the top of the metal oxide layer 16, the formed implant region not only exhibits a profile that the lower portion is narrow and the upper portion is wide (similar to an inverted triangle profile), compared with the implant region formed by the medium implant energy, in the implant region formed by the low implant energy, the region closer to the bottom of the metal oxide layer 16 will be narrower, and the region closer to the top of the metal oxide layer 16 will be wider. In some embodiments, nitrogen ions may also be implanted into the metal oxide layer 16 by other nitrogen-ion processes, for example, using a nitrogen-ion plasma process 50 to implant nitrogen ions into the metal oxide layer 16. In some embodiments, the nitrogen-ion plasma process 50 has a radio frequency (RF) power of between about 100 and about 1000 w. In some embodiments, the nitrogen-ion plasma process 50 has a nitrogen flow rate of between about 10 and about 300 sccm.

Figure 6C:
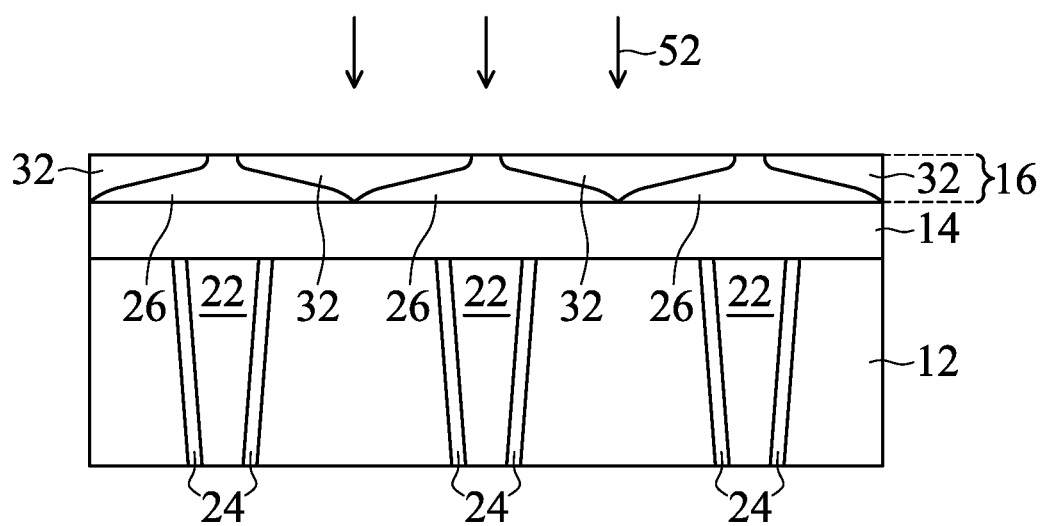

Referring to FIG. 6C, an annealing process 52 is then performed on the metal oxide layer 16 to form conductive filament regions 26 and nitrogen-containing regions 32 other than the conductive filament regions 26 in the metal oxide layer 16. In some embodiments, the annealing process 52 has an annealing temperature of between about 200 and about 500 degrees. The nitrogen-containing regions 32 can be defined by the nitrogen-ion implantation process 48, that is, the distribution regions (i.e. the conductive filament regions 26) of the conductive filaments in the metal oxide layer 16 are limited by the nitrogen-containing regions 32.

Figure 6D:
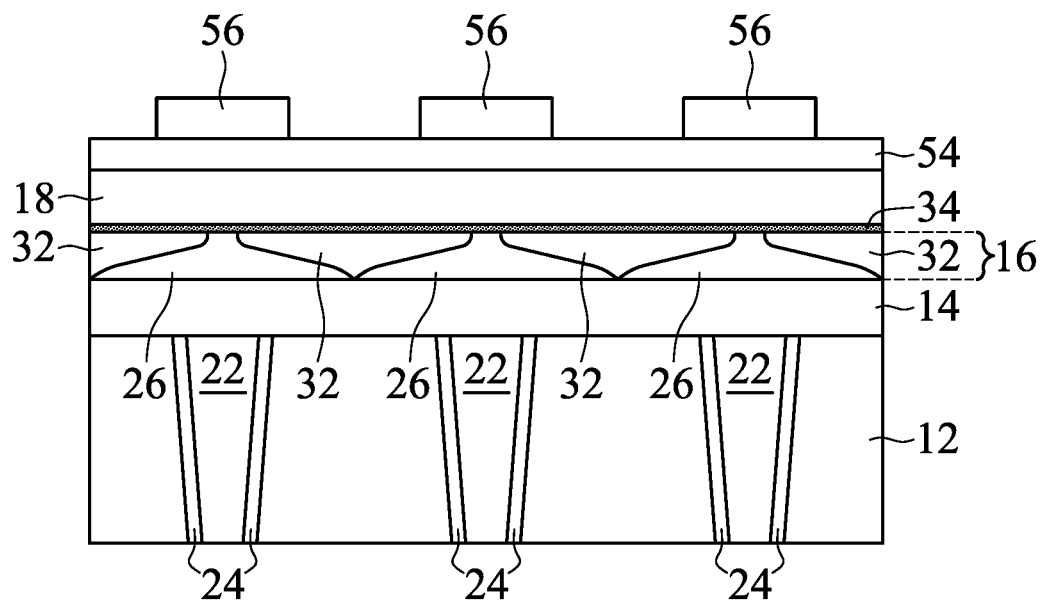

Referring to FIG. 6D, a first capping layer 34, a top electrode layer 18 and a hard mask layer 54 are sequentially formed on the metal oxide layer 16. Next, a patterned photoresist layer 56 is formed on the hard mask layer 54. In some embodiments, the hard mask layer 54 may include, for example, silicon nitride, silicon carbonitride (SiCN) or silicon oxynitride.

Figure 6E:
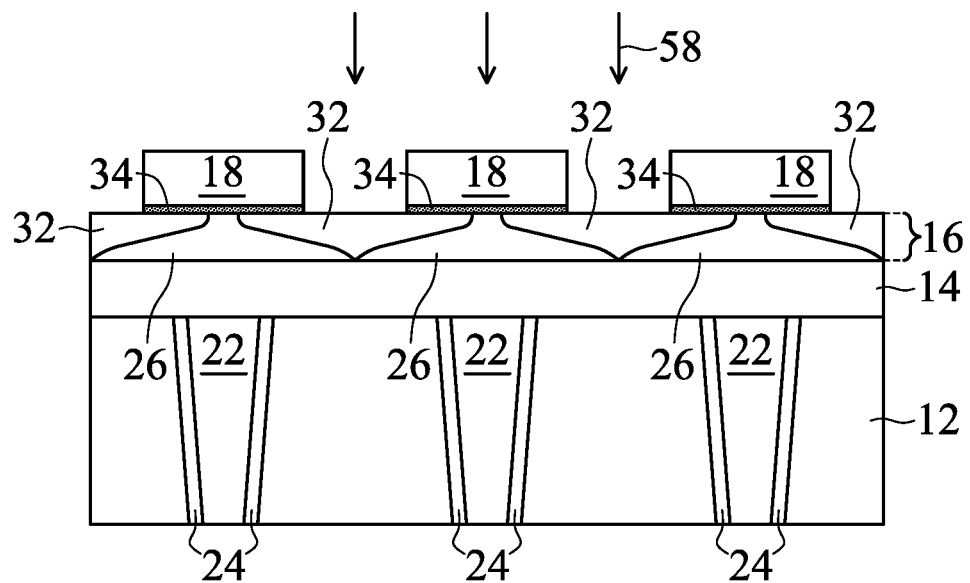

Referring to FIG. 6E, a lithography process and an etching process 58 are performed using the patterned photoresist layer 56 as a mask to form a stack of a patterned first capping layer 34 and a patterned top electrode layer 18 (i.e. top electrode), exposing a part of the metal oxide layer 16. Specifically, the conductive filament regions 26 in the metal oxide layer 16 are very susceptible to damage when etched. In this embodiment, since the exposed portions of the metal oxide layer 16 are the regions 32 rather than the conductive filament regions 26, using this method to fabricate the resistive random access memory, to better ensure the quality of the conductive filament regions 26 in the metal oxide layer 16.

Figure 6F:
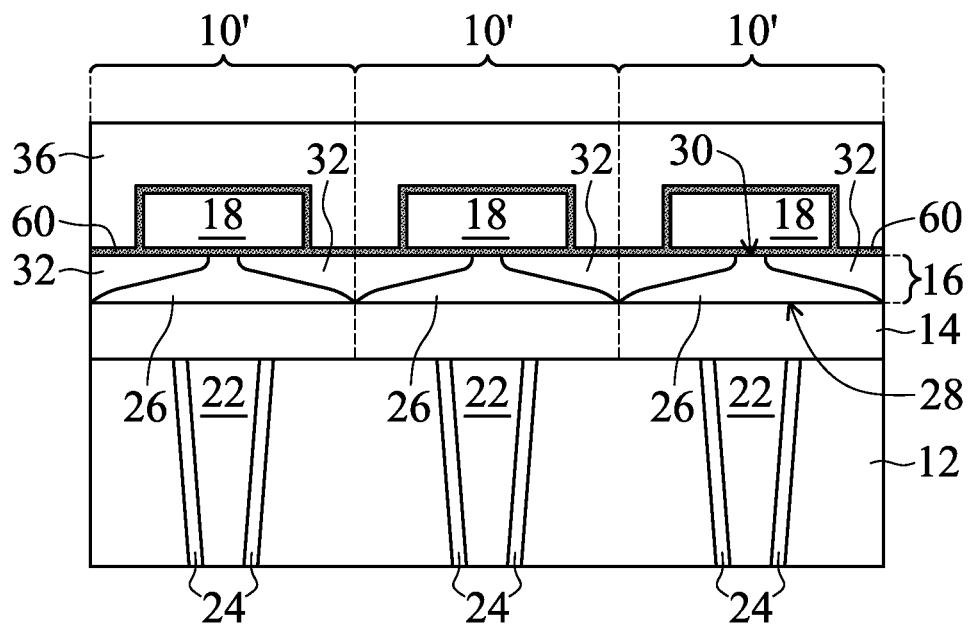

Referring to FIG. 6F, a second capping layer 60 is then formed on the metal oxide layer 16 and further covers the top electrodes 18. Next, a dielectric material layer 36 is formed on the second capping layer 60 and filled into the regions between the adjacent top electrodes 18. So far, the fabrication of the resistive random access memory 10 as shown in FIG. 1 has been completed.

Specifically, the resistive random access memory 10 of FIG. 1 includes a plurality of resistive random access memory units 10' connected to each other by the bottom electrode 14 and the metal oxide layer 16. The structural aspect and the fabrication method thereof can effectively prevent the sidewalls of the component from being damaged during the etching process.

Figure 6G:
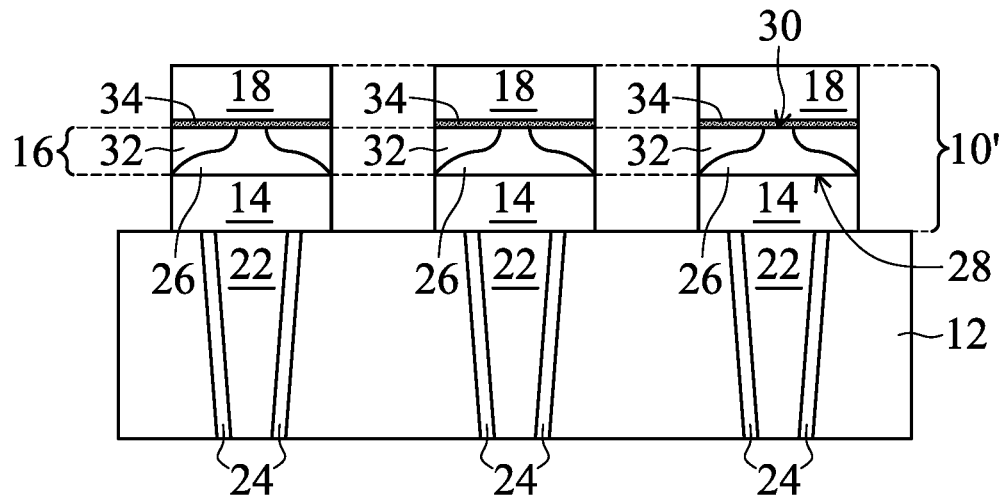

In some embodiments, the etching range of the etching process 58 can also be adjusted. Referring to FIG. 6G, for example, the top electrode layer 18, the first capping layer 34, the metal oxide layer 16 and the bottom electrode layer 14 are sequentially etched to form a plurality of resistive random access memory units 10' including a stake of a patterned bottom electrode layer 14 (i.e. bottom electrode), a patterned metal oxide layer 16, a patterned first capping layer 34 and a patterned top electrode layer 18 (i.e. top electrode), exposing a part of the substrate 12.

Figure 6H:
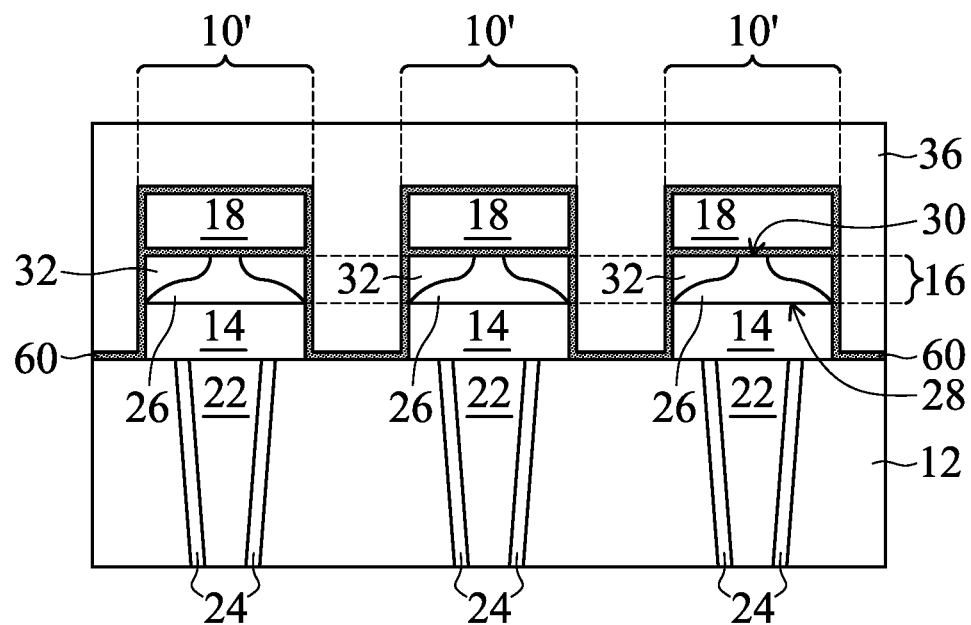

Referring to FIG. 6H, a second capping layer 60 is formed on the substrate 12 and further covers the resistive random access memory units 10'. Next, a dielectric material layer 36 is formed on the second capping layer 60 and filled into the regions between adjacent resistive random access memory units 10'. So far, the fabrication of the resistive random access memory 10 as shown in FIG. 2 has been completed.

Specifically, the resistive random access memory 10 of FIG. 2 includes a plurality of separated resistive random access memory units 10' on the substrate 12. The structural aspect and the fabrication method thereof can effectively avoid the mutual interference of the bottom electrodes between different components.

Figure 7A:
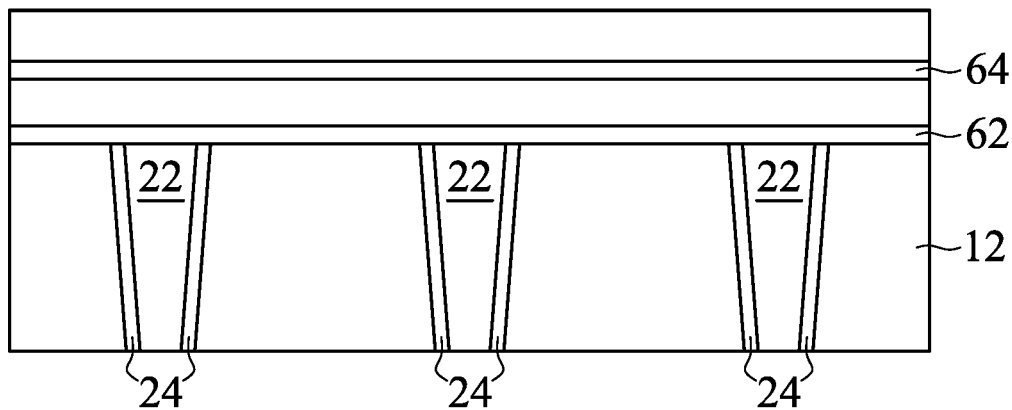
FIGS. 7A-7H shows a fabrication method in accordance with one embodiment of the invention.

Referring to FIG. 7A, in accordance with one embodiment of the invention, a cross-sectional view of a method for fabricating a resistive random access memory is shown. First, a substrate 12 is provided. Vias are formed in the substrate 12. Conductive material 22 and via liners 24 surrounding the conductive material 22 are formed in the vias. A first hard mask layer 62 is formed in the substrate 12 above the vias. A second hard mask layer 64 is formed in the substrate 12 above the first hard mask layer 62. In some embodiments, the first hard mask layer 62 and the second hard mask layer 64 may include any suitable silicon-containing compounds such as silicon nitride, silicon carbonitride (SiCN) or silicon oxynitride.

Figure 7B:
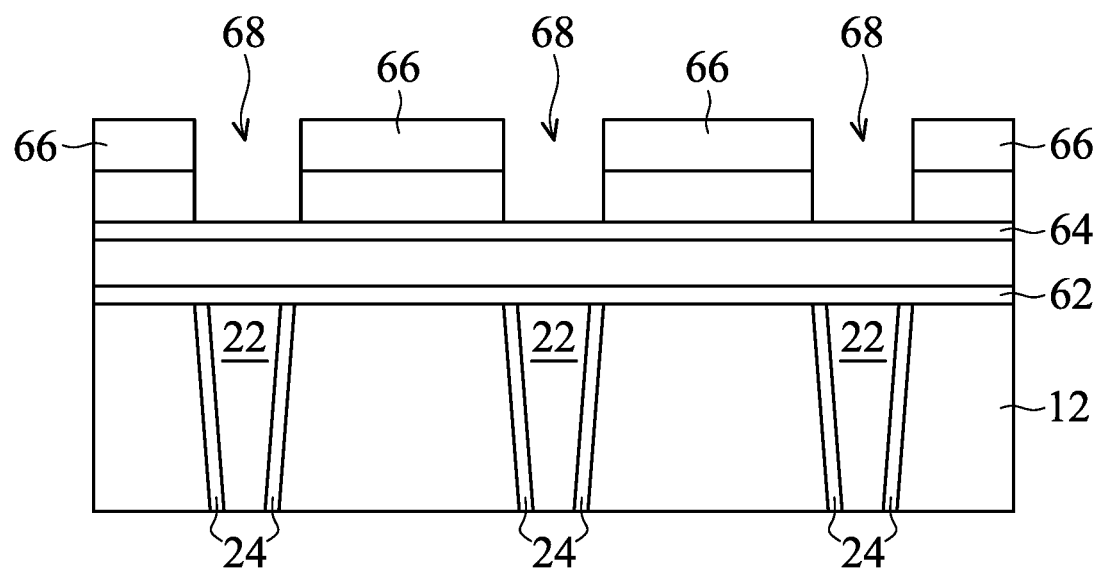

Referring to FIG. 7B, a patterned photoresist layer 66 is then formed on the substrate 12. Next, the substrate 12 is etched using the patterned photoresist layer 66 as a mask until the second hard mask layer 64 is exposed to form a plurality of vias 68, corresponding to the respective below vias filled with the conductive material 22.

Figure 7C:
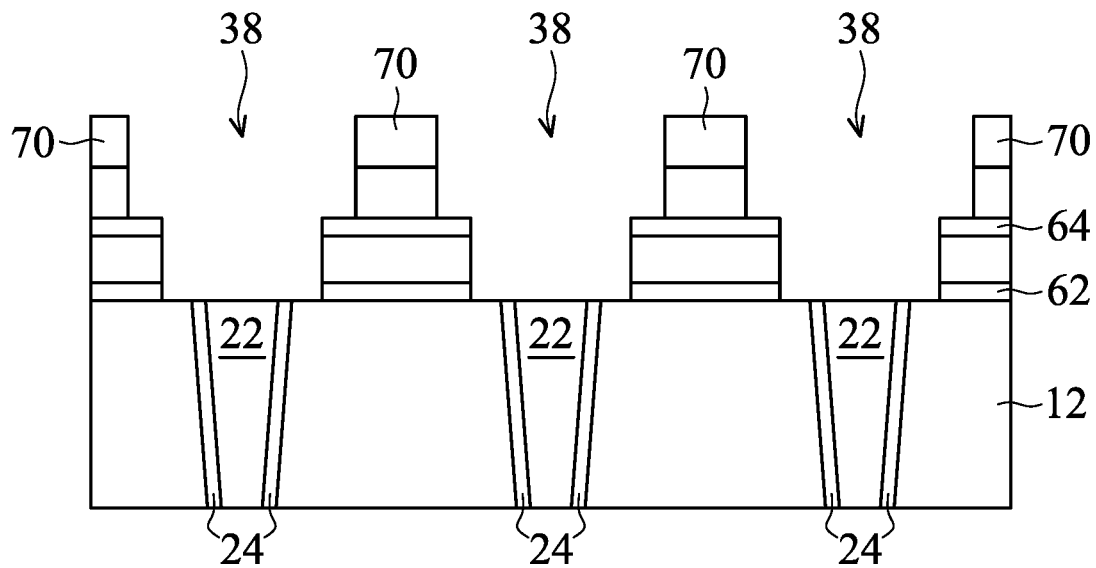

Referring to FIG. 7C, after removal of the patterned photoresist layer 66, a patterned photoresist layer 70 is formed on the substrate 12. Next, the substrate 12 is etched using the patterned photoresist layer 70 as a mask until the vias filled with the conductive material 22 are exposed to form a plurality of trenches 38, corresponding to the respective below vias filled with the conductive material 22.

Figure 7D:
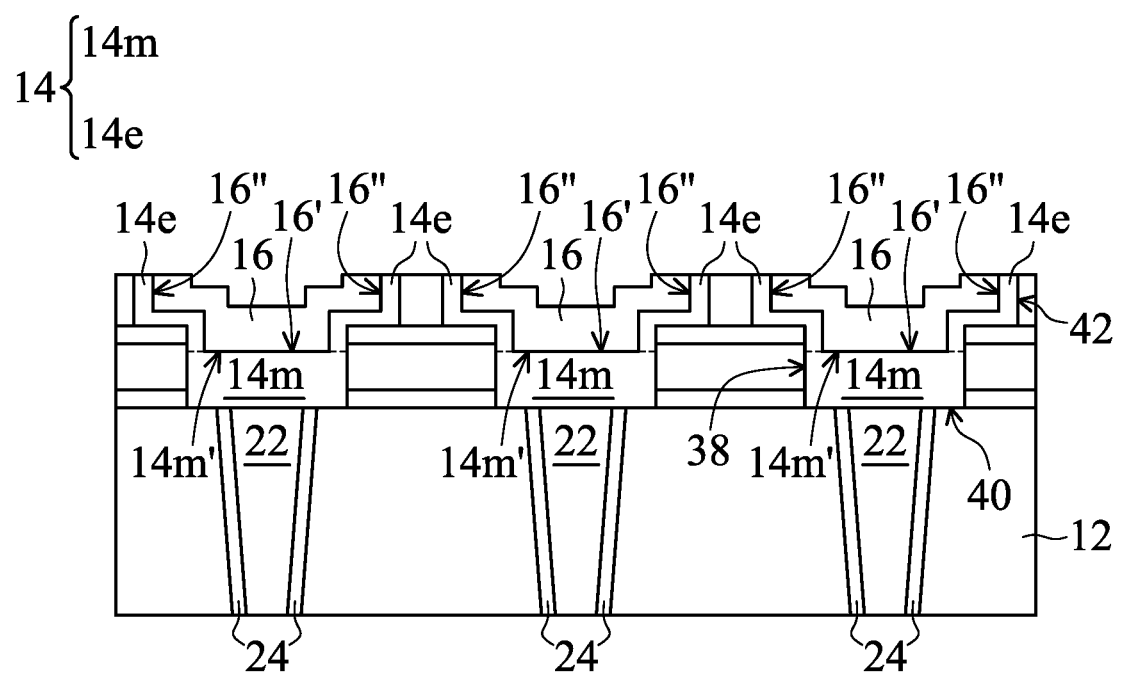

Referring to FIG. 7D, a plurality of bottom electrodes 14 are respectively formed on the bottom portions 40 and the sidewalls 42 of the trenches 38 and electrically connected to the below vias filled with the conductive material 22. Each of the bottom electrodes 14 includes a main portion 14$m$ and extending portions 14$e$. The extending portions 14$e$ extend from an upper surface 14$m$' of the main portion 14$m$ in a direction away from the vias filled with the conductive material 22. The main portion 14$m$ is formed on the bottom portion 40 and a part of the sidewalls 42 of the trench 38 and in contact with the below vias. The extending portions 14$e$ extend in a bent configuration and form on the sidewalls 42 of the trench 38, other than the regions occupied by the main portion 14$m$. Next, a plurality of metal oxide layers 16 are respectively formed on the bottom electrodes 14 in the trenches 38 and surrounded by the bottom electrodes 14. The metal oxide layers 16 are conformally formed on the bottom electrodes 14, that is, the bottom portions 16' of the metal oxide layers 16 are in contact with the main portions 14$m$ of the bottom electrodes 14, and the sidewalls 16" of the metal oxide layers 16 are in contact with the extending portions 14$e$ of the bottom electrodes 14.

Figure 7E:
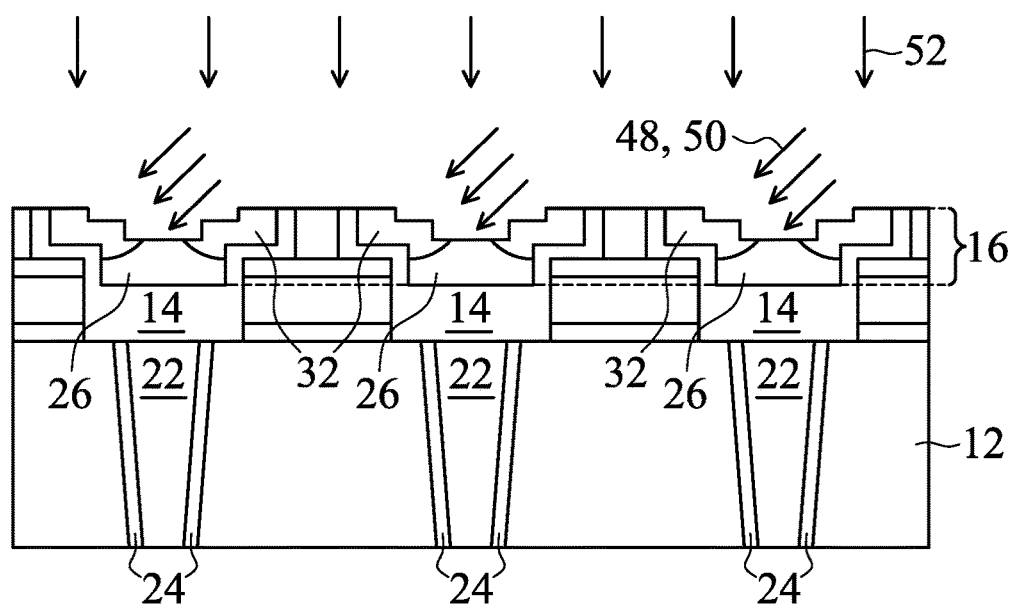

Referring to FIG. 7E, a nitrogen-ion process, for example a nitrogen-ion implantation process 48, is performed on the left and right sides of each metal oxide layer 16. In some embodiments, the implant angle of the nitrogen-ion implantation process 48 is between about 10 and about 80 degrees. There are four to eight rotations in the nitrogen-ion implantation process 48, and the rotation angle of each rotation is between about 45 and about 90 degrees. In some embodiments, the implant energy of the nitrogen-ion implantation process 48 is between about 0.2 and about 10 keV. In some embodiments, the implant concentration of the nitrogen-ion implantation process 48 is between about $1\times10^{14}$ and about $1\times10^{16}$ cm$^{-2}$. In some embodiments, nitrogen ions may also be implanted into the metal oxide layers 16 by other nitrogen-ion processes, for example, using a nitrogen-ion plasma process 50 to implant nitrogen ions into the metal oxide layers 16. In some embodiments, the radio frequency (RF) power of the nitrogen-ion plasma process 50 is between about 100 and about 1000 w. In some embodiments, the nitrogen flow rate of the nitrogen-ion plasma process 50 is between about 10 and about 300 sccm. Next, an annealing process 52 is performed on the metal oxide layers 16 to form conductive filament regions 26 in the central regions of the metal oxide layers 16, and form nitrogen-containing regions 32 other than the conductive filament regions 26 in the side regions of the metal oxide layers 16. In some embodiments, the annealing temperature of the annealing process 52 is between about 200 and about 500 degrees.

Figure 7F:
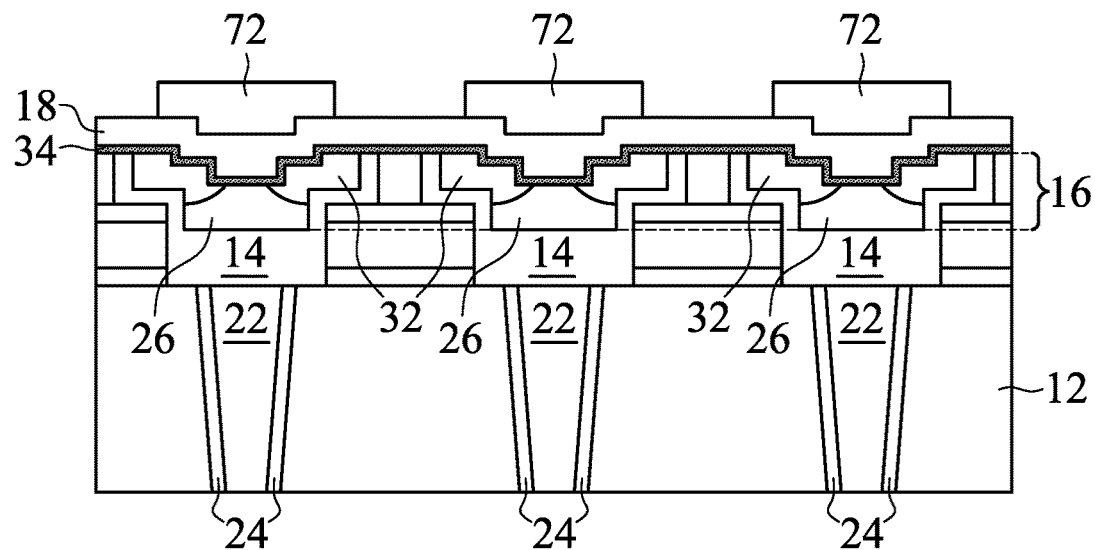

Referring to FIG. 7F, a first capping layer 34 and a top electrode layer 18 are sequentially formed on the substrate 12, the bottom electrodes 14 and the metal oxide layers 16. Next, a patterned photoresist layer 72 is formed on the top electrode layer 18.

Figure 7G:
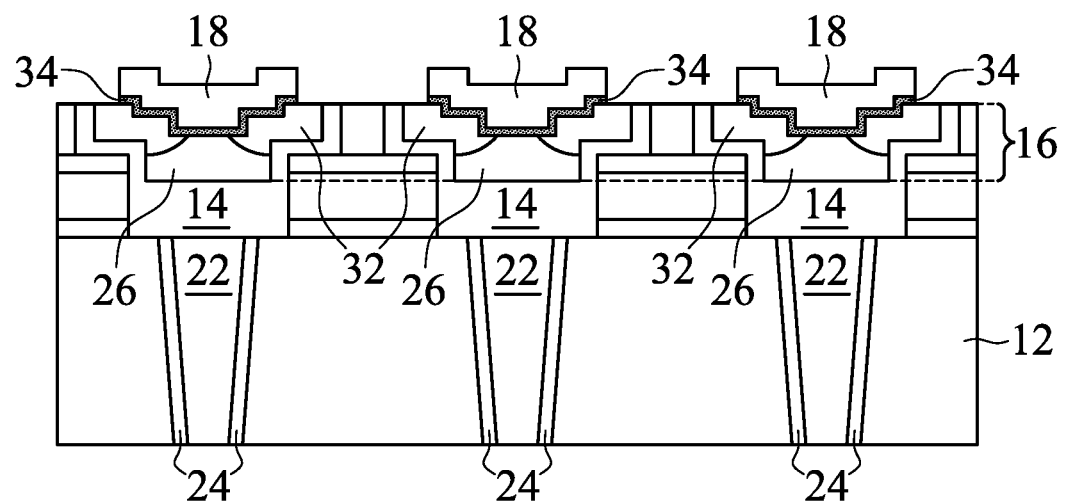

Referring to FIG. 7G, the top electrode layer 18 is etched using the patterned photoresist layer 72 as a mask to form a patterned top electrode layer 18 (i.e. top electrodes), exposing a part of the substrate 12.

Figure 7H:
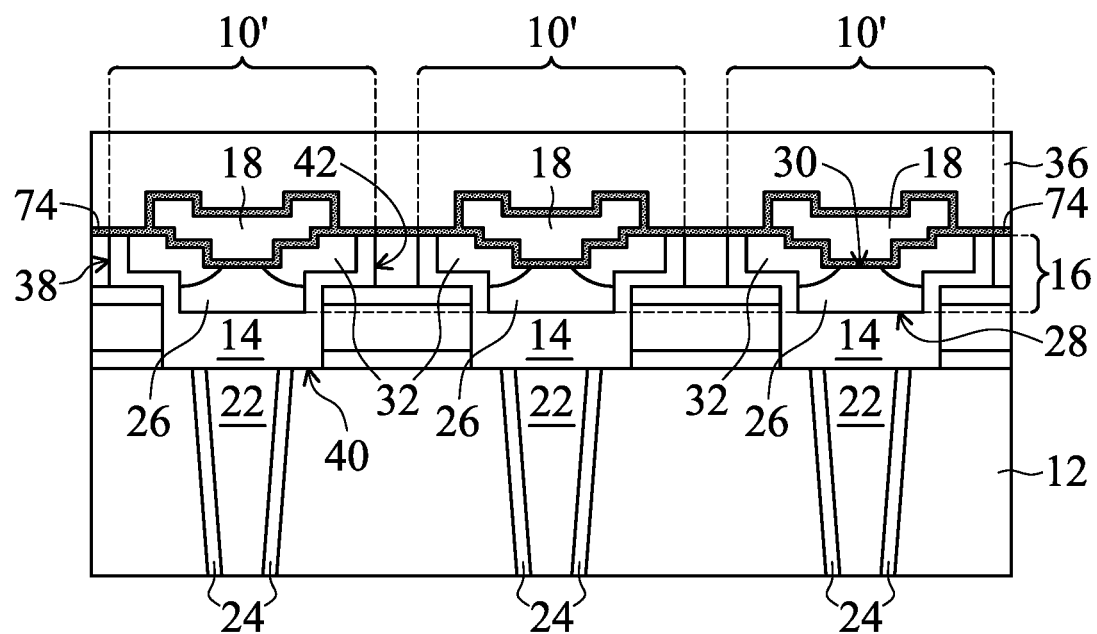

Referring to FIG. 7H, a third capping layer 74 is formed on the substrate 12, the bottom electrodes 14 and the metal oxide layers 16, and further covers the top electrodes 18. Next, a dielectric material layer 36 is formed on the third capping layer 74 and filled into the regions between adjacent top electrodes 18. So far, the fabrication of the resistive random access memory 10 as shown in FIG. 3 has been completed.

Specifically, the resistive random access memory 10 of FIG. 3 includes a plurality of separated resistive random access memory units 10' formed in the trenches 38 of the substrate 12. The structural aspect and the fabrication method thereof not only effectively avoid the mutual interference of the bottom electrodes between different components, but also achieve the self-alignment effect by the arrangement of the vias and the trenches.

Figure 8A:
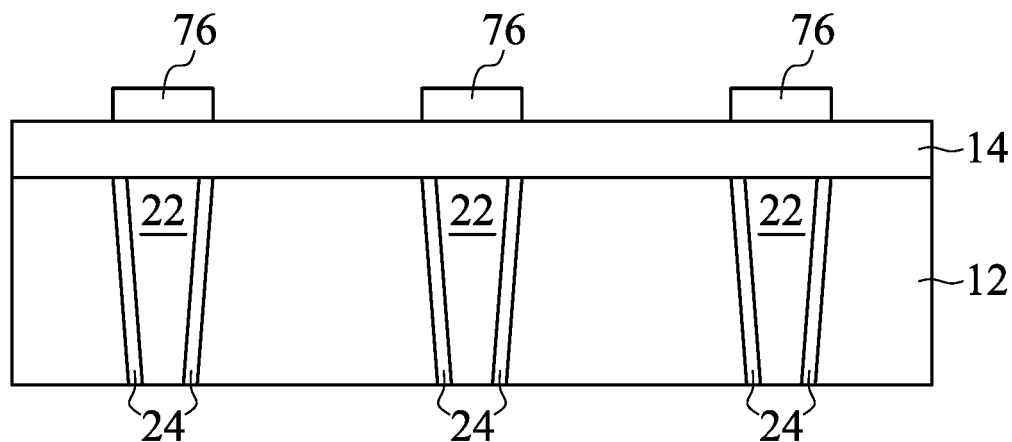
FIGS. 8A-8I shows a fabrication method in accordance with one embodiment of the invention.

Referring to FIG. 8A, in accordance with one embodiment of the invention, a cross-sectional view of a method for fabricating a resistive random access memory is shown. First, a substrate 12 is provided. Vias are formed in the substrate 12. Conductive material 22 and via liners 24 surrounding the conductive material 22 are formed in the vias. Next, a bottom electrode layer 14 is formed on the substrate 12, and a patterned photoresist layer 76 is then formed on the bottom electrode layer 14.

Figure 8B:
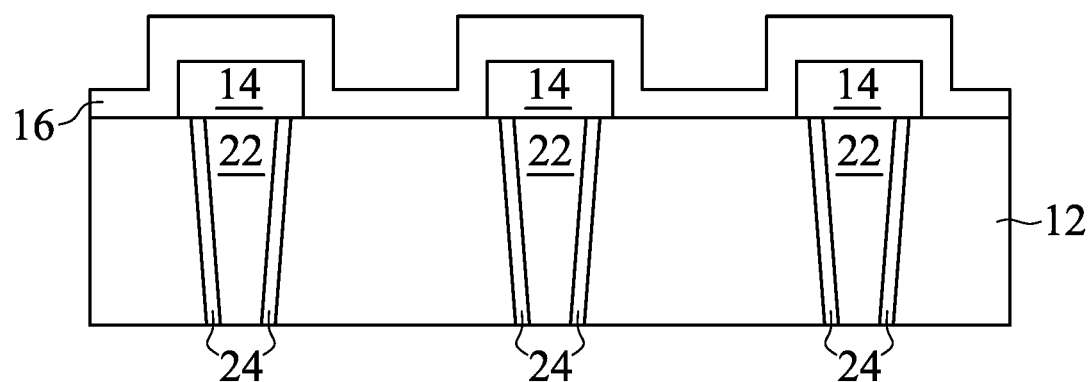

Referring to FIG. 8B, the bottom electrode layer 14 is etched using the patterned photoresist layer 76 as a mask to form a patterned bottom electrode layer 14 (i.e. bottom electrodes). Next, a metal oxide layer 16 is conformally formed on the substrate 12 and the bottom electrodes 14 and further covers the bottom electrodes 14.

Figure 8C:
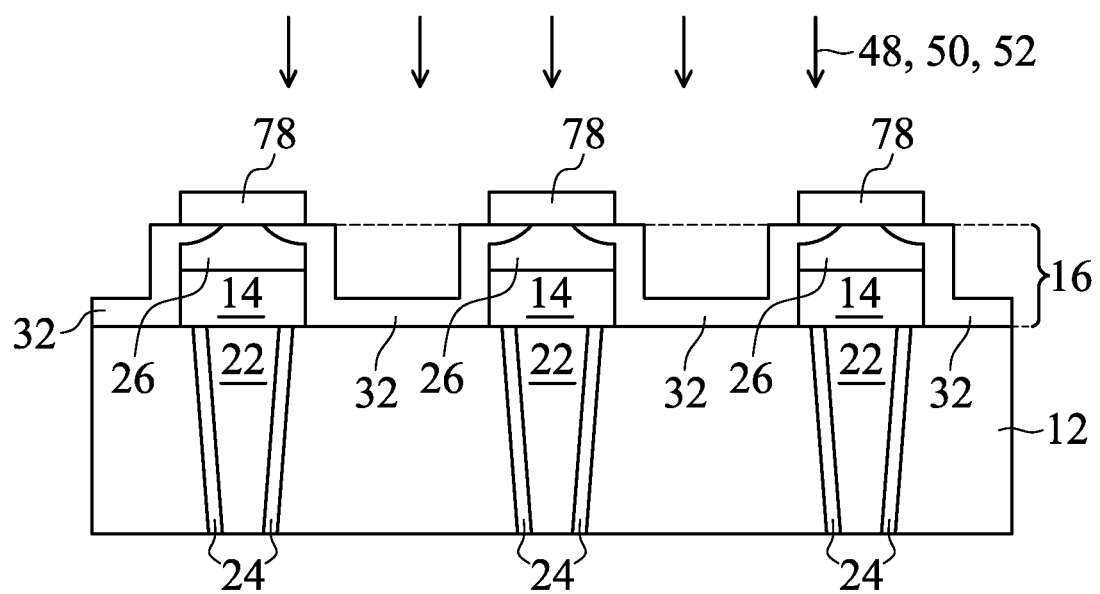

Referring to FIG. 8C, a patterned photoresist layer 78 is formed on the metal oxide layer 16. Next, a nitrogen-ion process, for example a nitrogen-ion implantation process 48, is performed on the metal oxide layer 16. In some embodiments, the implant angle of the nitrogen-ion implantation process 48 is between about zero and about 45 degrees. There are four to eight rotations in the nitrogen-ion implantation process 48, and the rotation angle of each rotation is between about 45 and about 90 degrees. In some embodiments, the implant energy of the nitrogen-ion implantation process 48 is between about 0.2 and about 10 keV. In some embodiments, the implant concentration of the nitrogen-ion implantation process 48 is between about $1\times10^{14}$ and about $1\times10^{16}$ cm$^{-2}$. In some embodiments, nitrogen ions may also be implanted into the metal oxide layer 16 by other nitrogen-ion processes, for example, using a nitrogen-ion plasma process 50 to implant nitrogen ions into the metal oxide layer 16. In some embodiments, the radio frequency (RF) power of the nitrogen-ion plasma process 50 is between about 100 and about 1000 w. In some embodiments, the nitrogen flow rate of the nitrogen-ion plasma process 50 is between about 10 and about 300 sccm. Next, an annealing process 52 is performed on the metal oxide layer 16 to form conductive filament regions 26 and nitrogen-containing regions 32 other than the conductive filament regions 26 in the metal oxide layer 16. In some embodiments, the annealing temperature of the annealing process 52 is between about 200 and about 500 degrees.

Figure 8D:
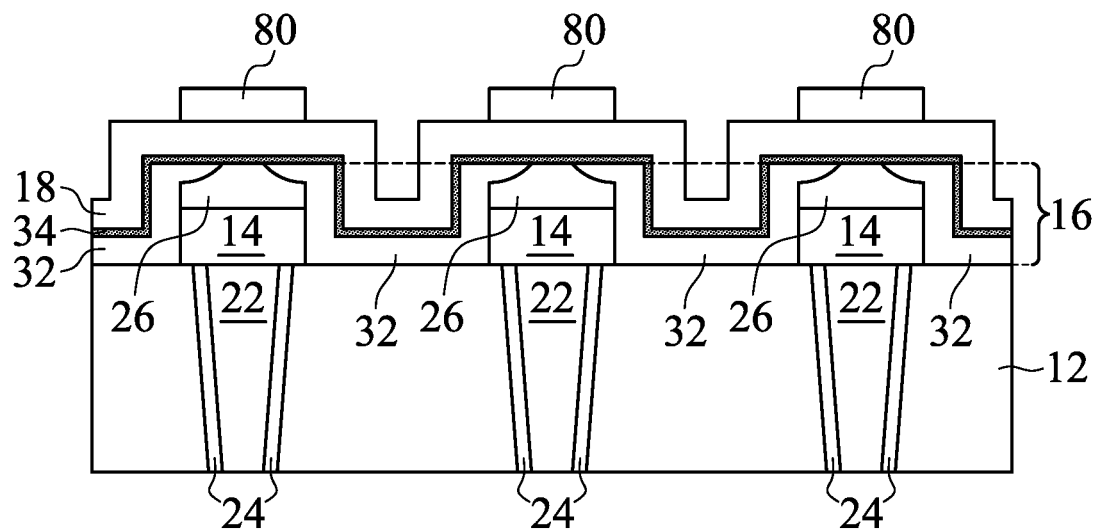

Referring to FIG. 8D, after removal of the patterned photoresist layer 78, a first capping layer 34 and a top electrode layer 18 are sequentially formed on the metal oxide layer 16. Next, a patterned photoresist layer 80 is formed on the top electrode layer 18.

Figure 8E:
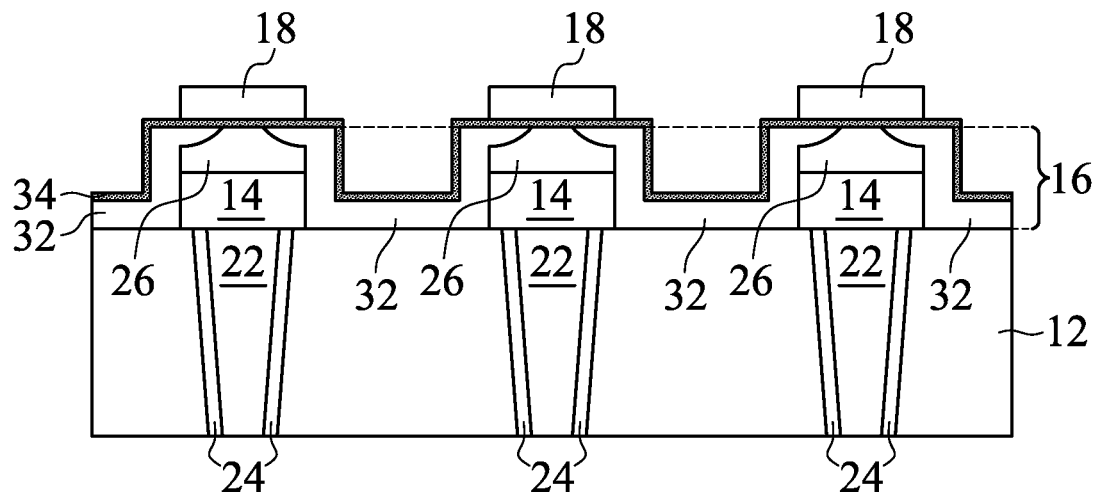

Referring to FIG. 8E, the top electrode layer 18 is etched using the patterned photoresist layer 80 as a mask to form a patterned top electrode layer 18 (i.e. top electrodes). The patterned photoresist layer 80 is then removed.

Figure 8F:
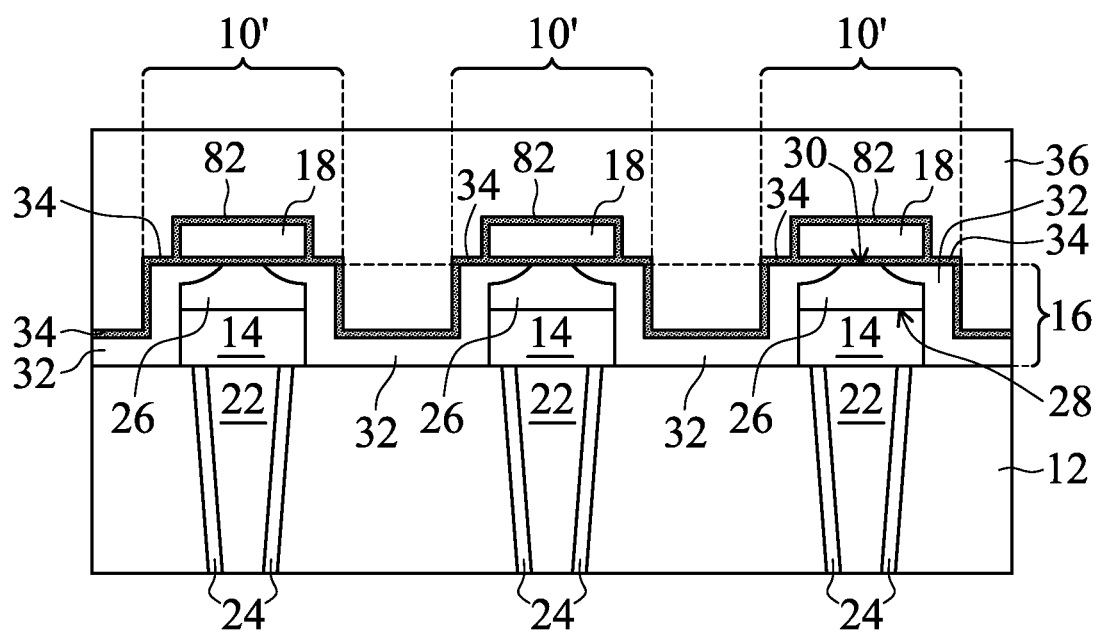

Referring to FIG. 8F, a fourth capping layer 82 is formed to cover the top electrodes 18. Next, a dielectric material layer 36 is formed on the first capping layer 34 and the fourth capping layer 82 and filled into the regions between adjacent top electrodes 18. So far, the fabrication of the resistive random access memory 10 as shown in FIG. 4 has been completed.

Specifically, the resistive random access memory 10 of FIG. 4 includes a plurality of resistive random access memory units 10' connected to each other by the metal oxide layer 16. The structural aspect and the fabrication method thereof can effectively prevent the sidewalls of the component from being damaged during the etching process.

Figure 8G:
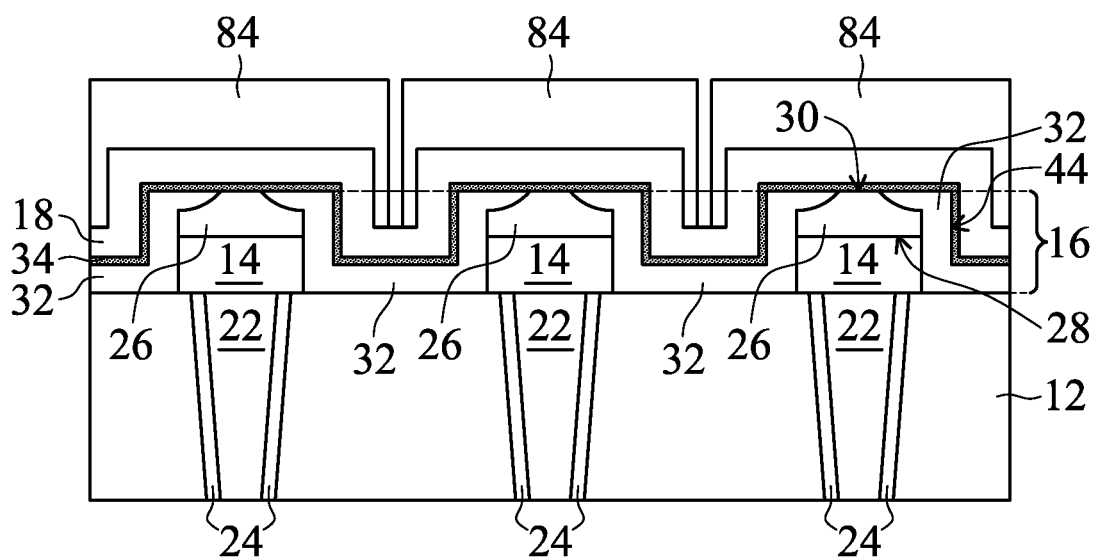

In some embodiments, the top electrode layer 18 may be etched using different mask layers, for example, referring to FIG. 8G, a patterned photoresist layer 84 is formed on the top electrode layer 18. Specifically, the patterned photoresist layer 84 further extends to cover the sidewalls 86 of the top electrode layer 18.

Figure 8H:
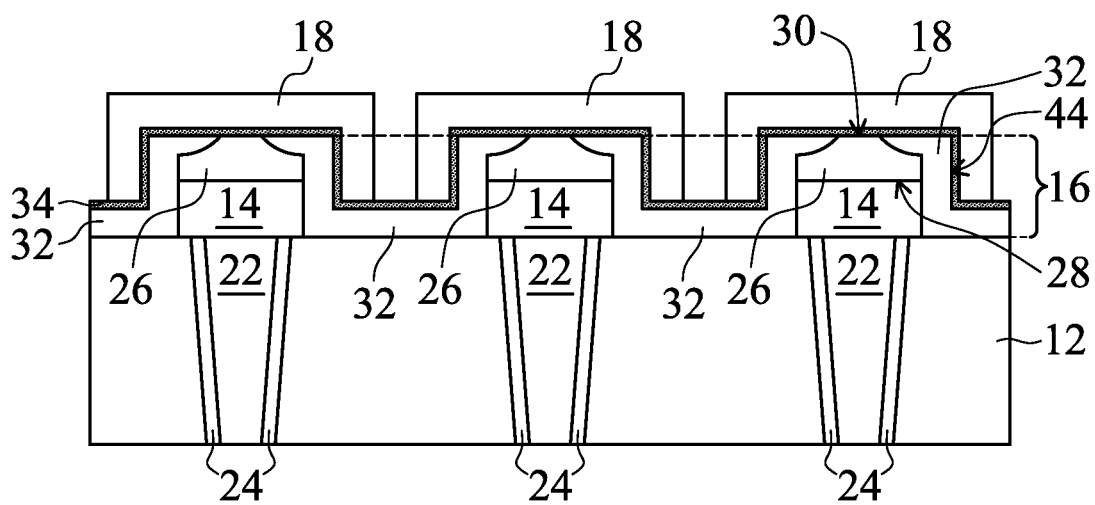

Referring to FIG. 8H, the top electrode layer 18 is etched using the patterned photoresist layer 84 as a mask to form a patterned top electrode layer 18 (i.e. top electrodes). The patterned photoresist layer 84 is then removed. At this time, the formed top electrodes 18 extend to cover the sidewalls 44 of the metal oxide layer 16.

Figure 8I:
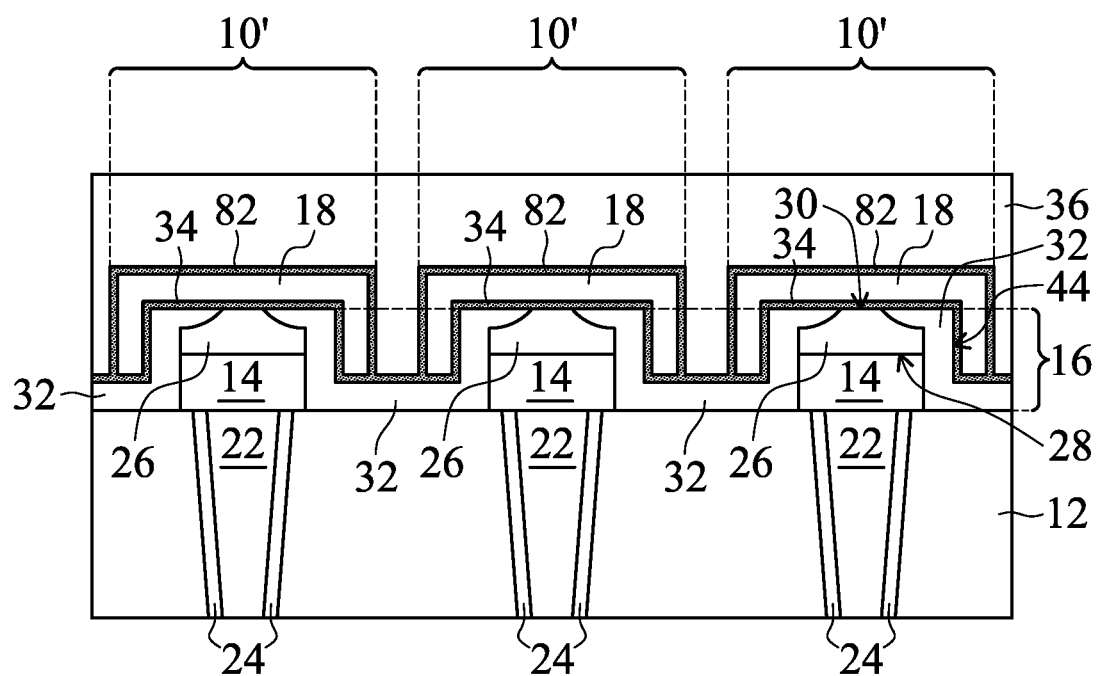

Referring to FIG. 8I, a fourth capping layer 82 is formed to cover the top electrodes 18. Next, a dielectric material layer 36 is formed on the first capping layer 34 and the fourth capping layer 82 and filled into the regions between adjacent top electrodes 18. So far, the fabrication of the resistive random access memory 10 as shown in FIG. 5 has been completed.

Specifically, the resistive random access memory 10 of FIG. 5 includes a plurality of resistive random access memory units 10' whose top electrodes 18 further extend to cover the sidewalls 44 of the metal oxide layer 16. The structural aspect of increasing the size of the top electrodes and the fabrication method thereof can make the electric field of the sidewalls of the component more uniform.

In the present invention, the distribution region (i.e. a conduction path formed by oxygen ion migration) of the conductive filament in the transition metal oxide (TMO) layer is defined and limited by related nitrogen-ion processes (e.g., ion implantation, plasma, annealing, etc.), effectively enhancing the local electric field (i.e. the electric field in the conductive filament region) in the component. The present resistive random access memory (RRAM) having the specific distribution profile of the conductive filament can effectively control the formation and rupture of a single conductive filament, avoiding the formation of multiple conductive filaments, and promoting the reliability of the memory, for example, improved endurance and retention. Furthermore, the present invention can reduce the forming/operation voltage and suppress the fluctuations between a high resistance state (HRS) and a low resistance state (LRS), allowing the components to maintain wide operating windows.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A resistive random access memory, comprising:
a bottom electrode, wherein the bottom electrode is a continuous bottom electrode;
a metal oxide layer formed on the bottom electrode, wherein the metal oxide layer comprises a plurality of conductive filament regions, each of the conductive filament regions has a bottom portion and a top portion with a flat upper surface, and the bottom portion has a width greater than that of the top portion, wherein the conductive filament regions comprise oxygen vacancies, and regions other than the conductive filament regions in the metal oxide layer are nitrogen-containing regions;
a plurality of top electrodes formed on the metal oxide layer, corresponding to the respective conductive filament regions;
a first capping layer disposed between the top electrodes and the metal oxide layer; and
a second capping layer disposed on the metal oxide layer and covering the top electrodes.

2. The resistive random access memory as claimed in claim 1, wherein the metal oxide layer is a continuous metal oxide layer.

3. The resistive random access memory as claimed in claim 2, wherein the conductive filament regions are adjacent to each other.

4. A method for fabricating the resistive random access memory of claim 1, comprising:
providing a substrate;
forming a plurality of trenches in the substrate;
forming a plurality of bottom electrodes in the trenches;
forming a plurality of metal oxide layers on the bottom electrodes and surrounded by the bottom electrodes;
performing a nitrogen-ion process on the metal oxide layers to form a plurality of conductive filament regions and nitrogen-containing regions other than the conductive filament regions in the metal oxide layers; and
forming a plurality of top electrodes on the metal oxide layers.

5. The method for fabricating a resistive random access memory as claimed in claim 4, wherein the nitrogen-ion process comprises a nitrogen-ion implantation process with an implant angle of between 10 and 80 degrees, an implant energy of between 0.2 and 10 keV, and an implant concentration of between $1\times10^{14}$ and $1\times10^{16}$ cm$^{-2}$ wherein there are four to eight rotations in the implantation process, and each rotation has a rotation angle of between 45 and 90 degrees.

6. The method for fabricating a resistive random access memory as claimed in claim 4, wherein the nitrogen-ion process comprises a nitrogen-ion plasma process with a radio frequency (RF) power of between 100 and 1000 w, and a nitrogen flow rate of between 10 and 300 sccm.

7. The method for fabricating a resistive random access memory as claimed in claim 4, further comprising performing an annealing process on the metal oxide layers after the nitrogen-ion process.

8. The method for fabricating a resistive random access memory as claimed in claim 7, wherein the annealing process has an annealing temperature of between 200 and 500 degrees.

9. A resistive random access memory, comprising:
a bottom electrode, wherein the bottom electrode comprises a plurality of separated portions;
a metal oxide layer formed on the bottom electrode, wherein the metal oxide layer comprises a plurality of conductive filament regions, each of the conductive filament regions has a bottom portion and a top portion with a flat upper surface, wherein the bottom portion has a width greater than that of the top portion, and regions other than the conductive filament regions in the metal oxide layer are nitrogen-containing regions, wherein the metal oxide layer comprises a plurality of separated portions;
a plurality of top electrodes formed on the metal oxide layer, corresponding to the respective conductive filament regions;
a first capping layer disposed between the top electrodes and the metal oxide layer;
a second capping layer disposed on the metal oxide layer and covering the top electrodes; and
a substrate having a plurality of trenches, wherein the separated portions of the bottom electrode are formed in the respective trenches, wherein the nitrogen-containing regions are disposed vertically between the conductive filament regions and the top electrodes.

10. The resistive random access memory as claimed in claim 9, wherein each of the separated portions of the metal oxide layer comprises one conductive filament region.

11. The resistive random access memory as claimed in claim 9, wherein each of the separated portions of the bottom electrode comprises a main portion and a plurality of extending portions, and the extending portions extend from an upper surface of the main portion in a bent configuration.

12. The resistive random access memory as claimed in claim 11, wherein the separated portions of the metal oxide layer are formed on the main portion of the bottom electrode and surrounded by the extending portions of the bottom electrode.

* * * * *